(12) United States Patent
Ghattas et al.

(10) Patent No.: US 11,144,691 B2
(45) Date of Patent: Oct. 12, 2021

(54) VIRTUAL ETHERNET MUTABLE PORT GROUP TRANSACTOR

(71) Applicant: Mentor Graphics Corporation, Wilsonville, OR (US)

(72) Inventors: Georges Antoun Elias Ghattas, Cairo (EG); Mohamed Ahmed Mostafa Shaaban, Cairo (EG); Robert John Bloor, Cambridge (GB)

(73) Assignee: Siemens Industry Software Inc., Plano, TX (US)

( * ) Notice: Subject to any disclaimer, the term of this patent is extended or adjusted under 35 U.S.C. 154(b) by 636 days.

(21) Appl. No.: 15/594,382

(22) Filed: May 12, 2017

(65) Prior Publication Data

US 2017/0351795 A1 Dec. 7, 2017

Related U.S. Application Data

(60) Provisional application No. 62/344,985, filed on Jun. 2, 2016.

(51) Int. Cl.
*G06F 17/10* (2006.01)
*G06F 30/33* (2020.01)

(52) U.S. Cl.
CPC .................................... *G06F 30/33* (2020.01)

(58) Field of Classification Search
CPC .................................................. G06F 17/5022
USPC ............................................................. 703/15
See application file for complete search history.

(56) References Cited

U.S. PATENT DOCUMENTS

| | | | | |
|---|---|---|---|---|
| 2013/0227367 A1* | 8/2013 | Czamara | ............ | G01R 31/3177 714/735 |
| 2013/0279496 A1* | 10/2013 | Takahashi | ............. | H04L 49/602 370/352 |
| 2014/0112339 A1* | 4/2014 | Safranek | ............. | G06F 13/4282 370/389 |
| 2015/0319072 A1* | 11/2015 | Chakrabarti | ............ | H04L 43/50 370/250 |
| 2016/0057040 A1* | 2/2016 | Bergeron | ................ | H04L 43/04 370/252 |
| 2016/0140284 A1* | 5/2016 | Han | ................. | G01R 31/31727 716/106 |
| 2016/0344788 A1* | 11/2016 | Cradick | ............. | G06F 16/9024 |

* cited by examiner

*Primary Examiner* — Andre Pierre Louis

(57) ABSTRACT

Disclosed herein are example embodiments of methods, apparatus, and systems for transactors configured for use in a hardware emulation environment and designed to adapt to speed changes dynamically at runtime in addition to providing dynamic port mapping. Among the embodiments disclosed herein is an emulation system comprising one or more configurable hardware components (e.g., configurable logic blocks) configured to implement a mutable port group transactor in communication with a design under test being emulated by the emulation system. The emulation system can further comprise a host computer in communication with the emulator and configured to provide configuration commands to the emulator that alter the mutable port group transactor from a first configuration to a second configuration.

18 Claims, 11 Drawing Sheets

900

910 — during an emulator configuration stage, transmit configuration data to hardware components of an emulator causing the hardware components to operate as a mutable port group transactor 912 — during a runtime stage in which the emulator is emulating a design under test, transmit runtime configuration data to the hardware components implementing the mutable port group, thereby causing one or more of a number of ports, a number of active lanes of one or more ports, a lane size of one or more ports, or a transmission speed of one or more ports to be altered

VIRTUAL ETHERNET MUTABLE PORT GROUP TRANSACTOR

CROSS-REFERENCE TO RELATED APPLICATIONS

This application claims the benefit of U.S. Provisional Application No. 62/344,985, entitled "VIRTUAL ETHERNET MUTABLE PORTS GROUP TRANSACTOR" and filed on Jun. 2, 2016, which is hereby incorporated herein by reference.

FIELD

This disclosure is directed towards designing and testing electronic designs. Particularly, this disclosure concerns a transactor that can be used during hardware emulation of a circuit design.

BACKGROUND

Electronic circuits, such as integrated circuits, are used in a variety of products, from automobiles to smart phones to personal computers. Designing and fabricating these circuit devices typically involves many steps, known as a "design flow." The particular steps of a design flow often are dependent upon the type of integrated circuit being designed, its complexity, the design team, and the integrated circuit fabricator or foundry that will manufacture the circuit. Typically, software and hardware "tools" will verify a design at various stages of the design flow by running software simulators and/or hardware emulators. The verification processes then are used to identify and correct errors in the design.

Several steps are common to most design flows. Typically, the specification for the new circuit initially is described at a very abstract level as a logical design. An example of this type of abstract description is a register transfer level ("RTL") description of the circuit. With this type of description, the circuit is defined in terms of both the exchange of signals between hardware registers and the logical operations that are performed on those signals. A register transfer level design typically employs a Hardware Design Language ("HDL"), such as the Very high speed integrated circuit Hardware Design Language ("VHDL") or the Verilog language. The logic of the circuit is then analyzed, to confirm that the logic incorporated into the design will accurately perform the functions desired for the circuit. This analysis is sometimes referred to as "functional verification."

In some instances, the functionality of the circuit design will be verified by simulating the operation of the design using software, such as, for example, the QUESTA family of simulators available from Mentor Graphics Corporation of Wilsonville, Oreg. Electronic design simulators determine, using software executing on a computer, what the various states of an electronic design would be when presented with some input stimulus.

Some designs, however, may be too large or complex to efficiently simulate using software. Instead, the functionality of the circuit design will be verified by emulating the circuit design using a hardware emulator. Examples of hardware emulators include the VELOCE family of emulators available from Mentor Graphics Corporation of Wilsonville, Oreg., the ZEBU family of emulators available from Synopsys of Mountain View, Calif., and the PALLADIUM family of emulators available from Cadence Design Systems of San Jose, Calif.

An emulator typically will provide a set of primitive components for emulating the operation of a circuit design. For example, emulators that use field-programmable gate array circuits can emulate the functionality of a circuit design using a combination of state elements, memories and lookup tables. Of course, other types of emulators may provide additional or alternate primitive components. For example, alternatively, an emulator may function by using combinatorial elements computing a selectable function over a fixed number of inputs.

Some circuit designs to be emulated include ports (e.g., Ethernet ports) that are configurable in terms of both speed and number during circuit operation. Such ports are sometimes used, for example, in circuits designed for use in network communication scenarios (e.g., circuits that support multi-port and/or multi-speed Ethernet communications as may be used in communication networks or at endpoint devices). To date, however, flexible ports have been difficult, if not impossible, to emulate in a way that appropriately models the runtime behavior of the circuit.

SUMMARY

Disclosed herein are example embodiments of methods, apparatus, and systems for transactors configured for use in a hardware emulation environment and designed to adapt to speed changes dynamically at runtime in addition to providing dynamic port mapping.

Among the embodiments disclosed herein is an emulation system comprising one or more configurable hardware components (e.g., configurable logic blocks) configured to implement a mutable port group transactor in communication with a design under test being emulated by the emulation system. The emulation system can further comprise a host computer in communication with the emulator and configured to provide configuration commands to the emulator that alter the mutable port group transactor from a first configuration to a second configuration. In particular implementations, the mutable port group transactor is configured to emulate an Ethernet port and to communicate with the design under test at runtime adaptable communication speeds. In some examples, the mutable port group transactor is further configured to communicate with the design under test using a runtime adaptable number of lanes. In certain examples, the mutable port group transactor is further configured to communicate with the design under test via a runtime adaptable number of ports. In some examples, the mutable port group transactor is further configured to communicate with the design under test using runtime adaptable lane widths. In certain implementations, the mutable port group transactor is compiled at compile time in accordance with a number of compile-time configurations that define one or more of: a maximum number of lanes that can carry data streamed from and to the mutable port group transactor; a maximum width of each that is interfaced from the mutable port group transactor; or a maximum number of port interfaces that can be enabled during runtime through the mutable port group transactor. In particular implementations, the mutable port group transactor is compiled at compile time in accordance with a number of compile-time per-port configurations that define one or more of: a maximum number of lanes that can carry data streamed from and to a respective port; a maximum width of each lane associated with the respective port; or an indication that the respective port is allowed to stream at a selected communication speed. In some implementations, the mutable port group transactor includes connections to a plurality of ports of the design under test and a subset of the connections of the mutable port group transactor can be altered without disturbing a different subset of the connections of the mutable port group transactor. In certain implementations, the mutable port group transactor is connected to the design under test via a routing matrix configured to provide a plurality of runtime adaptable connections between the mutable port group transactor and ports of the design under test. In some implementations, the mutable port group transactor is compiled at compile time in accordance with a compile-time configuration that defines a port ID offset identifying port numbers of the design under test relative to port numbers of the design under numbers connected to another mutable port group transactor.

Another embodiment is a computer-implemented method comprising an emulator configuration state and an emulator runtime stage, during the emulator configuration stage, configuration data is transmitted to an emulator, the configuration data being adapted to configure hardware components of an emulator to operate as a mutable port group transactor. During the emulator runtime stage in which the emulator is emulating a design under test, runtime configuration data is transmitted to the hardware components implementing the mutable port group, thereby causing one or more of a number of ports, a number of active lanes of one or more ports, a lane size of one or more ports, or a transmission speed of one or more ports to be altered. In certain implementations, the configuration data causes the mutable port group transactor to have one or more of: a user-defined maximum number of lanes that can carry data streamed from and to the mutable port group transactor, a maximum width of each port that is interfaced from the mutable port group transactor, or a maximum number of port interfaces that can be enabled during runtime through the mutable port group transactor. In particular implementations, the configuration data is per-port configuration data that causes a respective port of the mutable port group transactor to have one or more of: a maximum number of lanes that can carry data streamed from and to the respective port; a maximum width of each lane associated with the respective port; or an indication that the respective port is allowed to stream at a selected communication speed. In some implementations, the mutable port group transactor is configured to emulate an Ethernet port in communication with one or more ports of the design under test. In certain implementations, the mutable port group transactor is connected to the design under test via a routing matrix configured to provide a plurality of runtime adaptable connections between the mutable port group transactor and ports of the design under test. In some implementations, the configuration data defines a port ID offset identifying port numbers of the design under test relative to port numbers of the design under test connected to another mutable port group transactor.

The foregoing and other objects, features, and advantages of the disclosed technology will become more apparent from the following detailed description, which proceeds with reference to the accompanying figures.

DETAILED DESCRIPTION

I. General Considerations

Figure 1:
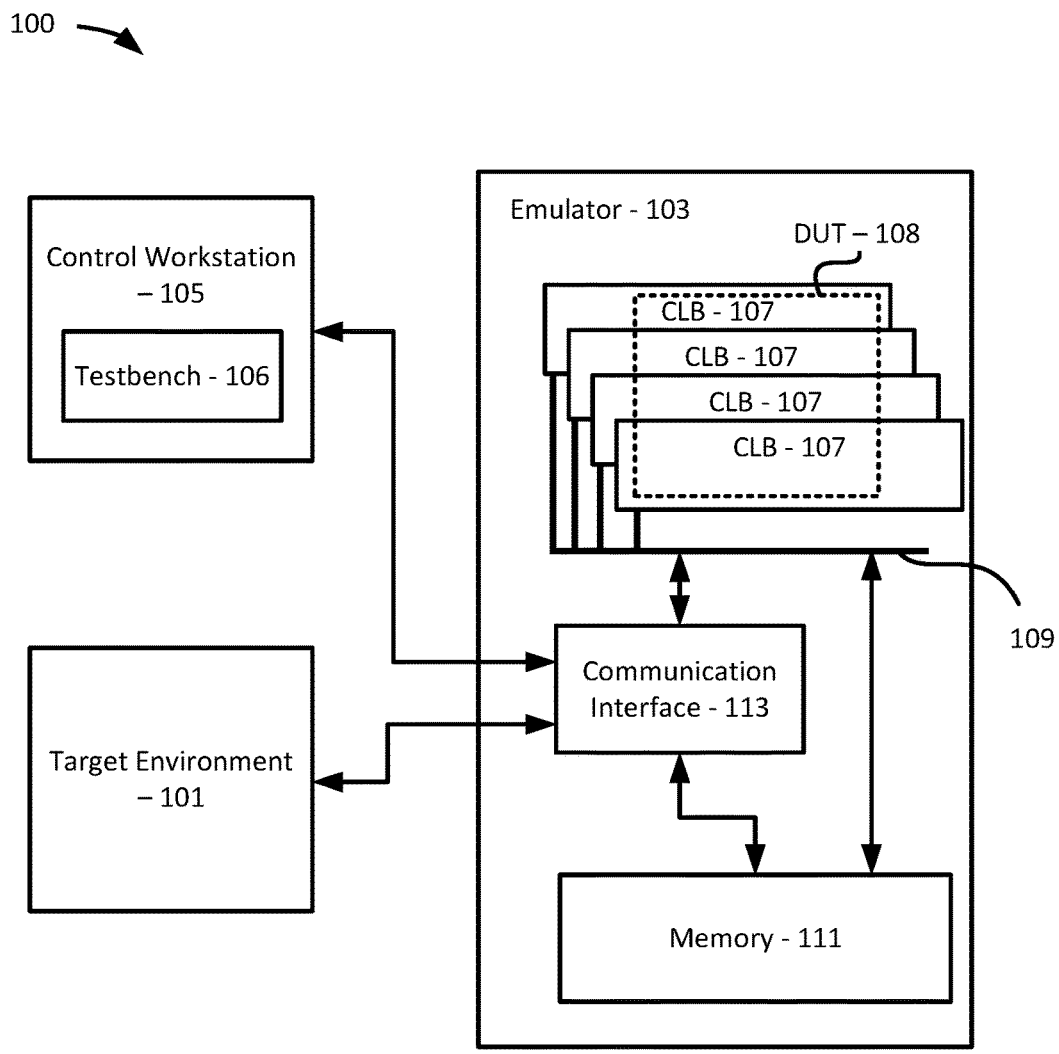
FIG. 1 shows a design under test ("DUT") loaded onto an emulator.

Disclosed herein are example embodiments of methods, apparatus, and systems for transactors configured for use in a hardware emulation environment and designed to adapt to speed changes dynamically at runtime in addition to providing dynamic port mapping. The disclosed methods, apparatus, and systems should not be construed as limiting in any way. Instead, the present disclosure is directed toward all novel and nonobvious features and aspects of the various disclosed embodiments, alone and in various combinations and subcombinations with one another. Furthermore, any features or aspects of the disclosed embodiments can be used in various combinations and subcombinations with one another or with other methods, apparatus, and systems. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine" and "generate" to describe the disclosed methods. These terms are high-level abstractions of the actual operations that are performed. The actual operations that correspond to these terms may vary depending on the particular implementation and are readily discernible by one of ordinary skill in the art. Furthermore, as used herein, the term "and/or" means any one item or combination of items in the phrase.

Any of the disclosed methods can be implemented as computer-executable instructions used to synthesize a design for emulation purposes in accordance with the disclosed compile-time parameters, to control emulation during runtime, and/or to produce configuration bits adapted for configuring one or more field-programmable gate arrays of an emulation system to implement any of the disclosed embodiments. Such computer-executable instructions or configuration bits can be stored on one or more computer-readable media (e.g., non-transitory computer-readable media, such as one or more optical media discs, volatile memory components (such as DRAM or SRAM), or non-volatile memory components (such as hard drives)), or some combination thereof. Any of the computer-executable instructions or configuration bits for implementing the disclosed techniques as well as any intermediate or final data created and used during implementation of the disclosed systems can be stored on one or more computer-readable media (e.g., non-transitory computer-readable media). The computer-executable instructions can be part of, for example, a dedicated software application or as part of an application that is accessed or downloaded via a network (e.g., a local-area network, a wide-area network, a client-server network, or other such network). Such software or configuration bits can be executed/applied using a single computer or in a network environment.

For clarity, only certain selected aspects of the software-based embodiments are described. Other details that are well known in the art are omitted. For example, it should be understood that the software-based embodiments are not limited to any specific computer language or program. For instance, embodiments of the disclosed technology can be implemented by software written in C++, Java, Perl, JavaScript, Adobe Flash, Python, JINI, .NET, Lua or any other suitable programming language. Likewise, embodiments of the disclosed technology are not limited to any particular computer or type of hardware. Details of suitable computers and hardware are well known and need not be set forth in detail in this disclosure.

II. Illustrative Emulation Environment

In some embodiments, the disclosed technology is implemented as part of a hardware emulation environment, such as environment 100. Environment 100 includes an emulator 103 and a control workstation 105, also referred to as a "host". The emulator 103 includes a plurality of configurable logic blocks 107, a configurable interconnect 109, a memory 111, and a communication interface 113. As those of skill in the art will appreciate, a number of different technologies exist for implementing the emulator 103. For example, the configurable logic blocks 107 may be part of one or more field-programmable gate arrays (FPGAs). Further, the configurable logic blocks 107 may include one or more look-up tables and/or sequential state elements (e.g., flip-flops and/or latches). Alternatively, the emulator 103 may be implemented using a processor-based architecture formed from multiple individual programmable processors. In some implementations, the configurable interconnect 109 may be a cross-bar device, a multiplexer, or some other configurable network or combination thereof. Further, inter-FPGA communications may be routed through configurable networks, including FPGAs or cross-bar devices configured to handle such communications.

The control workstation 105, also referred to as the "host", is used to program the configurable logic blocks 107 and the configurable interconnect 109 to imitate or mimic the behavior of the electronic device based upon the design for that device and, in the illustrated example, to test the design by applying a testbench 106. FIG. 1 shows a design under test ("DUT") 108 "loaded" onto the emulator 103. The behavior of the DUT 108 can then be determined by operating the emulator 103. More specifically, the configurable logic blocks 107 and the configurable interconnect 109 are configured such that, when the emulator is provided with an electrical signal (e.g., stimulus from the testbench), and the configurable logic blocks 107 operate in response to the stimulus, then the output corresponds with the output that would have been generated by an integrated circuit device manufactured according to the DUT 108 in response to the same stimulus. This process is often referred to as emulation.

In some instances, emulation is performed using one or more test signals from a target system or target environment 101 in which the final fabricated design will ultimately operate (e.g., the communication network in which the final integrated circuit manufactured from the DUT will operate). Such emulation is often referred to as "in-circuit emulation". In other embodiments, however, emulation is performed without a target environment 101.

The communication interface 113 and the memory 111 may be used, for example, to facilitate programming the emulator 103, and for providing various debugging features that enable an engineer to verify the functionality of the DUT 108.

III. Overview of Disclosed Technology

Disclosed herein are example embodiments of an EMPG (Ethernet Mutable Port Group) port that can be used in an hardware emulator and that is configured to adapt to a change in speed at runtime. Example embodiments of the EMPG are capable of distributing the bandwidth streamed through it, across its lanes to a different number of ports, and at different speeds and/or interfaces configurable at runtime.

Figure 2:
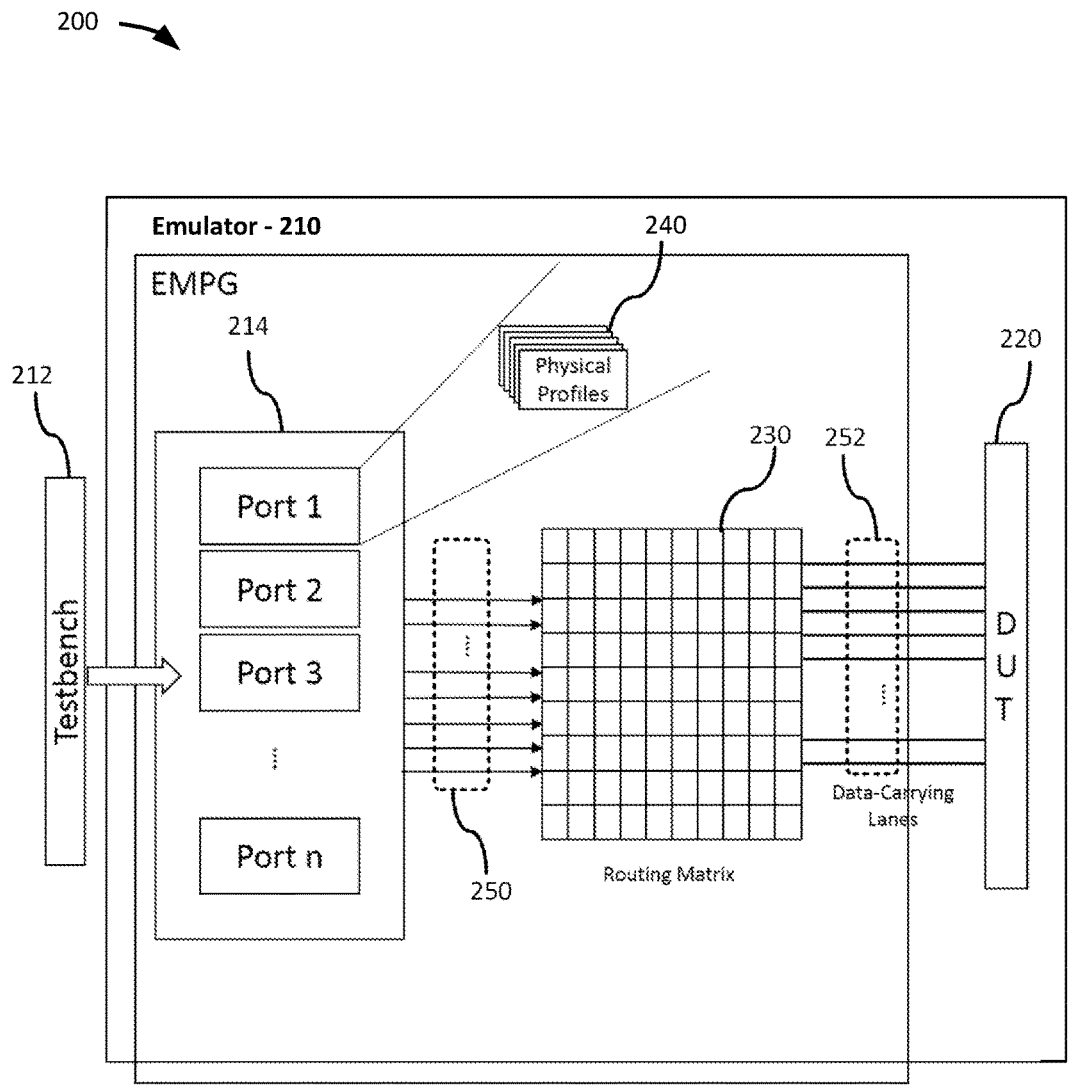
FIG. 2 is a schematic block diagram illustrating an example embodiment of a mutable port group ("MPG") deployed in an emulator in accordance with the disclosed technology.

FIG. 2 is a schematic block diagram 200 illustrating an example embodiment of an EMPG deployed in an emulator in accordance with the disclosed technology. In particular, FIG. 2 illustrates an emulator 210 in communication with a testbench 212 (e.g., provided by a host computer in communication with the emulator 210). The illustrated emulator 210 is configured to emulate a series of EMPG local ports 214 (labeled ports "1" through "n"). The EMPG ports 214 provide channels for data streaming from and to a design under test 220. In the illustrated embodiment, the channels pass through a routing matrix 230, discussed in more detail below.

In particular embodiments, each EMPG port acts as an independent channel for data streaming, offering flexible modes of operation. Embodiments of EMPG also provide flexible lanes mapping, allowing for different channel combinations and differentiated modes of operation. Embodiments also provide a flexible means to assign a set of Ethernet ports to a set of data-carrying lanes for the purpose of verifying the runtime configuration effects on a similarly connected set of Ethernet ports in a design. This can be done, for example, by having a number of physical profiles (a representative set of which is illustrated as 240) that are defined for each EMPG generic port.

In particular implementations, a physical profile for a port comprises one or more of the following data elements: an ID value, the number of physical lanes associated with the port, a width of each lane, the number of internal virtual lanes deployed by a common PCS layer, and/or the number of slices in each block of data. Data is then arranged according to the physical profiles to adapt data to the profile output specifications.

Further, in certain examples, each of the EMPG generic local port lanes (represented by lanes 250) can be mapped to any of the EMPG global lanes (represented by lanes 252) through having a permutation matrix (e.g., the routing matrix 230) defining the EMPG generic local ports lanes routing on to the EMPG lanes. This matrix mapping can be deployed through having a set of maps linking both sending and receiving channels. This mapping can allow for a variation of data operations for transmission and verification within an EMPG, like inter-port skewing or extending the functionality to data repetition on unused lanes.

IV. Illustrative Embodiments

Example embodiments include a generic transactor that is capable of adapting to speed changes (e.g. 100G to 40G) dynamically at runtime in addition to dynamic port mapping. One of the purposes of this runtime adaption is to provide a virtual Ethernet solution for emulation systems with the capability to interface with any 3rd party IP Core that also supports runtime speed switching. Example port speeds to run with the example transactor include, but are not limited to, 100G, 50G, 40G, 25G, and 10G.

The subsections below include a description of an example interface for the transactor, then provide an example use model. Further, a dynamic-configuration example is provided to demonstrate one exemplary way of configuring the design using the use model, thereby showing how to switch the configurations dynamically.

A. Mutable Port Group ("MPG") Transactor Interface

Example embodiments of the disclosed mutable port group ("MPG") transactor (also referred to as a mutable ports group transactor) adapt to a change in speed at runtime. The speed change can be achieved, for example, by updating the virtual ethernet and the speed-adaptable ports used by the DUT with the desired configuration.

In some embodiments, the MPG transactor is capable of distributing the bandwidth streamed through it across its lanes to a different number of ports and at different speeds/interfaces configured at runtime. It can be capable of having multiple port-interfaces at, for example, 10G, 25G, 40G, 50G or 100G, each with a certain corresponding number of lanes as is illustrated further in the description.

In particular embodiments disclosed herein, an MPG transactor is a group of a configurable number of ports (one port or multiple ports) having a configurable Physical Coding Sublayer ("PCS") interface and/or a configurable Physical Medium Attachment Sublayer ("PMA") interface to be connected to DUT ports. The available ports, lanes, and/or speeds for the MPG transactor are initially defined at compile time. The user then has the ability to instruct an MPG transactor to mutate its ports in order to match the DUT configuration, whenever it changes during runtime. In particular embodiments, each MPG port combined with its corresponding DUT port acts as an independent channel for data streaming.

B. Compile-Time Configuration

In accordance with one example embodiment for compile-time configuration, one or more of the following compile-time parameters can be configured (e.g., for each transactor):

MAX_NUMBER_LANES (N). Represents the number of Serializer/Deserializer ("SerDes") lanes to be interfaced from the group. At runtime, this number represents the maximum number of lanes that could be utilized for streaming through this group.

MAX_LANE_WIDTH. Represents the width of each lane that is interfaced from the group. At runtime, this number represents the maximum lane width that could be utilized for streaming through this group. This parameter could be, for example, either 20b or 40b, though any other lane width parameter is also possible.

MAX_NUMBER_PORTS (M). Represents the maximum number of local port-interfaces inside the group that could be enabled at runtime for streaming through this group. The runtime-enabled ports are mapped inside an ethernet packet generation monitor ("EPGM").

GLOBAL_PORT_ID_OFFSET. Represents the global port ID offset for the local port-interfaces, of this group, in the design. The global ID of each local port inside this group is mapped using its local ID inside the group and this offset.

Figure 3:
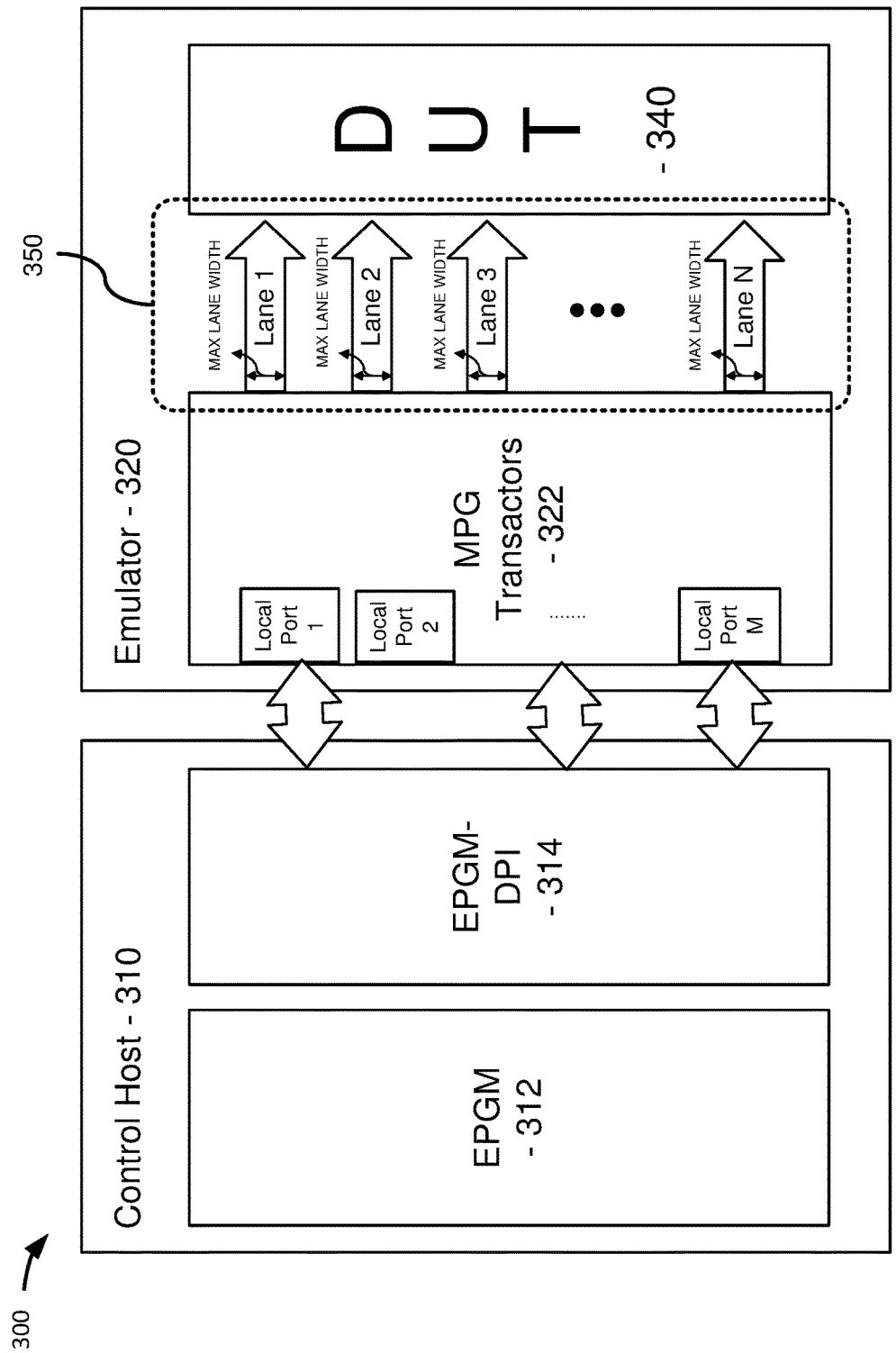
FIG. 3 is a schematic block diagram illustrating an example emulator implementing embodiments of the disclosed MPG transactors to communicate with a design under test and with a control host.

FIG. 3 is a schematic block diagram 300 illustrating an example emulator implementing embodiments of the disclosed MPG transactors to communicate with a design under test and with a control host. In particular, FIG. 3 shows a control host 310 (e.g., a PC workstation or other computing device in communication with an emulator) and an emulator 320. In the illustrated embodiment, the control host 310 comprises an Ethernet packet generation monitor ("EPGM") 312 and a EPGM direct programming interface ("DPI") 314 in communication with the emulator 320. As illustrated, the emulator 320 comprises a mutable port group ("MPG") transactor 322 to implement the ports (shown as "ports 1" through "port m") in the configurable logic blocks of the emulator 320. Additionally, FIG. 3 shows lanes 350 from the MPG transactor 322 to the DUT 340.

Moreover, in an example emulator implemented in accordance with the disclosed technology, a DUT (e.g., a single DUT) can interface with multiple MPG transactors deployed in the emulator. The deployed MPG transactors could be in communication with one or more control hosts by having one or more of these MPG transactors communicating with the control host(s) (e.g., a PC workstation or other computing device in communication with the emulator). In this setup, another controller component running on a workstation or any other computing device in communication with the control host(s) could be used to communicate with the set of test drivers, generators and/or monitors (e.g., EPGMs) on each control host. In other words, an emulator could be connected to multiple control hosts where one or more of the MPGs can be connected to a single control host with single or multiple sets of test drivers, generators and/or monitors (e.g., EPGMs) and proxies between any of the previous and the emulator (e.g., EPGM-DPIs).

C. Runtime Configuration

In particular embodiments, each MPG transactor (such as MPG transactor 322) can be configured at runtime through a virtual Ethernet connection to run on the specified set of ports, speeds, lanes and/or lane width. In particular implementations, these "ports" appear as appropriately labelled, but individually distinct media access control components ("MACs") exactly as the current ports appear in the EPGM 312 on the control host 310. Further, the specification of packets, or bundles to be streamed and monitored, could be done for each local port independently allowing different test cases to run on different ports in the same manner it is done on ungrouped distinct ports.

In certain implementations, a set of MPG transactors (shown as the MPG transactors 322) interface with the DUT 340. The MPG transactors are implemented via the configurable logic blocks of the emulator. Further, each MPG is configured to have the desired number of ports, speeds, lanes and/or lane width. In one particular example, one or more of the following virtual ethernet Tcl commands may be used to specify the configuration of MPG ports (e.g., add, remove, and/or update local MPG ports and their lanes attachment setup).

mpgLocalPort <PORT_CONFIG_NAME>--lanes <LANES_COUNT>--laneSize <LANE_WIDTH> mpgConfig <MPG_ID>--localPortID <LOCAL_PORT_ID>[--setPort <PORT_CONFIG_NAME>--startLaneIndex <START_LANE_INDEX_VALUE>--speed <PORT_ETHERNET_SPEED>]|[--removePort]|[--clear]

where "--lanes" represents the number of SerDes (serializer/deserializer) lanes to be assigned to the port from the MPG, "--laneSize" represents the lane size for each lane that belongs to the specified port handle, "--localPortID" represents the local port ID to which the action (set or remove) would be applied upon, "--setPort" sets the specified local port ID for the specified MPG_ID with the given "mpgLocalPort" "PORT_CONFIG_NAME" handle name in order to activate this specified local port if it is inactive at the time of applying the configuration or updating its runtime configuration if it is an already active port at the time of applying of the configuration, "--startLaneIndex" represents the start lane index for which the local port lanes will be attached to, "--speed" represents a speed tag for runtime configuration of the specified local port ID, "--removePort" removes/deactivates the specified local port ID from the running MPG configuration whose ID is specified by MPG_ID parameter, "--clear" removes/deactivates all local ports from the running MPG configuration whose ID is specified by MPG_ID parameter.

The previous commands can be used to define an MPG configuration. In order to apply this configuration, and in one example implementation, the following command can be used:

applyMpgConfig <MPG_ID>[--localPortID <LOCAL_PORT_ID]

where "MPG_ID" specifies the MPG_ID upon which configuration should be applied, and "--localPortID" represents the local port ID on which the configuration to be applied upon.

So, for example, consider a scenario where it is desired to configure a group of 2 MPGs, each having its MAX_NUMBER_PORTS value of 2, and their GLOBAL_PORT_ID_OFFSET parameters are 0 and 2 respectively, with the following configuration: (a) MPG 1 running on 100 G (Local Port 1) with 4 lanes, each is 40-bit width; and (b) MPG 2 running on 50G (Local Ports 1 and 2), each port of them has 2 lanes, each is 40-bit width.

In this case, the following set of commands could be utilized:

mpgLocalPort mpg1_Ip1 --lanes 4 --laneSize 40
    mpgLocalPort mpg2_Ip1 --lanes 2 --laneSize 40
    mpgLocalPort mpg2_Ip2 --lanes 2 --laneSize 40
    mpgConfig 1 --localPortID 1 --setPort mpg1_Ip1 --startLaneIndex 1
    mpgConfig 2 --localPortID 1 --setPort mpg2_Ip1 --startLaneIndex 1
    mpgConfig 2 --localPortID 2 --setPort mpg2_Ip2 --startLaneIndex 3
    applyMpgConfig 1
    applyMpgConfig 2

The previous commands would configure the design to have 3 ports, with global IDs 1, 3, and 4, where 1 belongs to MPG 1, while 3 and 4 belong to MPG 2. So, in such case MPG 1 has only one of its ports configured (port with Global ID 1), while its other port (port with Global ID 2) would not appear in such setup. On the other hand, MPG 2 would have both of its ports configured in this setup (ports with Global IDs 3 and 4).

In such a case, both MPG 1 and MPG 2 would be needed to be compiled with having at least a max of 4 SerDes lanes, and a max of 40-bit lane width. The same three port configurations could be also configured through only 1 MPG by altering these previous commands to be applied on a single MPG only and having this MPG being compiled with at least 8 SerDes lanes with 40-bit width for each of them.

D. Individual MPG Runtime Configuration

In some embodiments, the previous "applyMpgConfig" command can be used to reconfigure an individual MPG without affecting other MPGs, so streaming and/or snooping on other MPGs would still continue as it is. So, for example and with reference to the previous example, to reconfigure MPG 1 to have two 50G ports instead of a 100G port, the following set of Tcl commands can be used:

mpgLocalPort mpg1_Ip1_u --lanes 2 --laneSize 40
    mpgLocalPort mpg1_Ip2_u --lanes 2 --laneSize 40
    mpgConfig 1 --localPortID 1 --setPort mpg1_Ip1_u --startLaneIndex 1
    mpgConfig 1 --localPortID 2 --setPort mpg1_Ip2_u --startLaneIndex 3
    applyMpgConfig 1

This set of commands would reconfigure MPG 1 without affecting MPG 2 ports. The resulting design would have 4 ports, with global IDs 1, 2, 3, and 4; where 1 and 2 belong to MPG 1, while 3 and 4 belong to MPG 2. In one implementation example of these commands, local port 1 of MPG 1 should be neither streaming nor snooping upon applying the configuration on it.

Other runtime commands can also be used in embodiments of the disclosed technology. For instance, a direct programming interface ("DPI") function can be used. The DPI function can be used as a form of exchanging runtime configuration data to an MPG instance. For instance, a DPI function (e.g., "SetLocalPortParams") can be used to exchange data from the testbench to an MPG instance. The data exchanged through the DPI function can include the runtime configuration for a certain local port of an MPG instance.

Other methods or forms could also be used to apply the runtime configurations. For example, a direct setting of proper MPG registers through any provided interface that can set the emulated MPG transactor instance registers can be used. More generally, any form of exchanging data parameters from the host (or any user interface) to the emulated MPG instance can be used to configure the runtime parameters of any of the local ports residing within an MPG instance.

In some examples, the Tcl commands above are translated to data parameters to be exchanged through the aforementioned DPI function to the MPG instance.

Further, any upper layer rather than Tcl commands could be built above this DPI function or similar one or more, whereas one can translate the form of commands from that layer to parameters defined by this or these function(s) so that one could call it after that with the translated parameters to apply the needed runtime configurations. An example of this layer could be a C/C++ API functions, a GUI interface, python or perl functions/commands, and/or defined commands through socket interface or any other programmable S/W layer.

E. Individual MPG Local Port Configuration

In certain embodiments, the previous "applyMpgConfig" command can be used to reconfigure an individual local port within MPG without affecting other local ports within the same MPG; so streaming and/or snooping on other ports would still continue as it is. So, for example and with reference to the previous example, to reconfigure local port 1 of MPG 1 to be 25G port instead of a 50G port, without affecting local port 2 which would be working as it is as a 50G port, the following set of commands could be used:

mpgLocalPort mpg1_Ip1_u2 --lanes 1 --laneSize 40
mpgConfig 1 --localPortID 1 --setPort mpg1_Ip1_u --startLaneIndex 1
applyMpgConfig 1 # this would only affect local port 1 without affecting any verification or streaming activities on other active local ports within the same MPG This set of commands would reconfigure local port 1 of MPG 1 without affecting other local ports within MPG 1. The resulting design would have 4 ports, with global IDs 1, 2, 3, and 4; where 1 and 2 belong to MPG 1, while 3 and 4 belong to MPG 2. In one implementation example of these commands, local port 1 of MPG 1 should be neither streaming nor snooping upon applying the configuration on it.

F. Example Supported Runtime Configurations

The following table represents illustrative runtime configurations that can be supported by one example implementation for each port in an MPG. The specified values, however, can vary from implementation to implementation and are not to be construed as limiting. For example, more or fewer port speeds may be available, faster or slower port speeds may be available, more or fewer numbers of lanes may be available, and/or larger or smaller lane widths may be available.

TABLE 1

| Port Speed | Number of Lanes | Lane Width (bits) |
|---|---|---|
| 100 G | 4 | 40 |
| 50 G | 2 | 40 |
| 40 G | 2 | 40 |
| 40 G | 4 | 20 |
| 10 G | 1 | 20 |
| 25 G | 1 | 40 |
| 1 G | 1 | 10 |

G. Runtime Virtual Ethernet Ports Mapping

In certain example embodiments, upon using a MPG Transactor, the ports inside each MPG are mapped to a fixed set of port IDs depending on the MAX_NUMBER_PORTS parameter provided for each MPG at the compilation time. So, for example, if MPG '1' is set to have a maximum number of 10 ports with GLOBAL_PORT_OFFSET_ID of 0, its ports would get assigned global IDs from 1 to 10 and then MPG '2' global port IDs would start from ID 11, given its GLOBAL_PORT_OFFSET_ID is 10. The EPGM GUI would be displaying the EPGM global Port ID for a currently configured port as well as the corresponding MPG_ID and the corresponding MPG local Port ID.

The MPG_ID can be used to identify a specific MPG among others and is assigned during the compilation time of each MPG. The MPG local Port ID is the ID of a port relative to position within a specific MPG. Further, the combination of MPG_ID and MPG local port ID can be considered as a unique identifier for a specific port.

A Virtual Ethernet Tcl command to get global port ID in the design given its MPG ID and its local port ID inside this MPG, may be utilized as follows:

getGlobalPortId --mpg <MPG_ID>--localPortId <LOCAL_PORT_ID>, where LOCAL_PORT_ID represents the ID of the port inside the given MPG.

To fetch an MPG ID from a global port ID, the following command may be used:

getMPGId --globalPortId <PORT_GLOBAL_ID>.

While to get a local port ID inside an MPG, given its global Port ID, the following command may be used:

getLocalPortId --globalPortId <PORT_GLOBAL_ID>.

Other commands can also be deployed to fetch the available ports connected in the design. The first of these commands would be the one related to getting available MPGs in the design, which may have the following format:

availableMPGs

In one example, this command would return the available MPGs in the design in the following format [1 2 3 . . . ].

In order to get the global port IDs of a certain MPG; the following command may be used:

availablePorts --mpg <MPG_ID>

In one example, this command would return the active global port IDs of the given MPG_ID.

Given the previous commands, the user can use either the fixed global port IDs or the MPG referencing to write scripts/test cases that verify and stream/snoop upon the ports included in an MPG.

H. Illustrative Example

Figure 4:
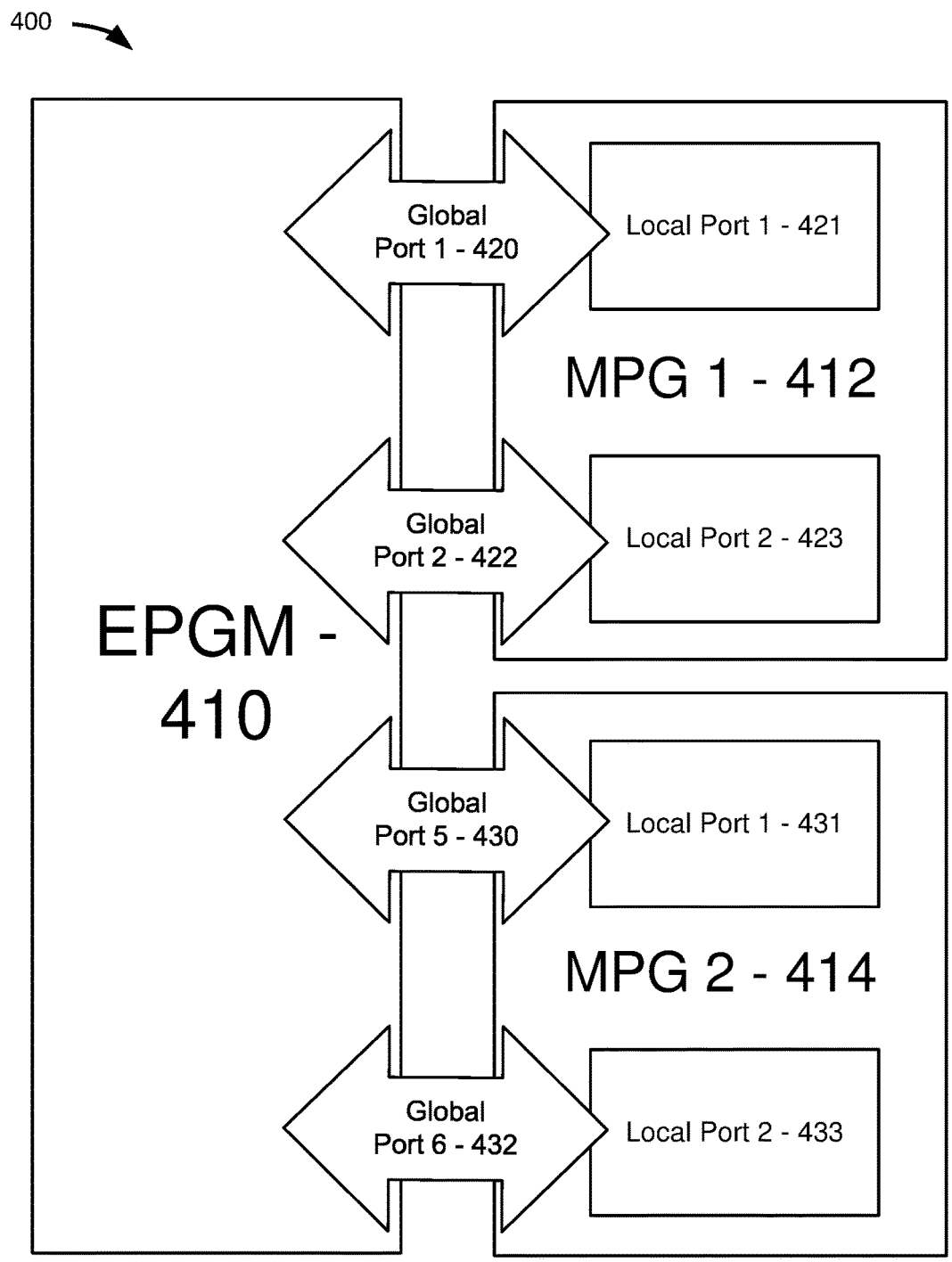
FIG. 4 is a schematic block diagram illustrating an example usage scenario in accordance with embodiments of the disclosed technology.

To illustrate the disclosed technology, consider for example a configuration having 2 MPGs, and having the MAX_NUMBER_PORTS compile-time parameter set for them with the value 4, and the GLOBAL_PORT_ID_OFFSET compile-time parameter set with the values 0 and 4 for MPG 1 and MPG 2 respectively. Assuming each of these MPGs has two local ports, of their 4 local ports, activated, as shown in schematic block diagram 400 of FIG. 4. If a user needs to get the global Port ID of the second port in the second MPG, then the following command could be used:

getGlobalPortId --mpg 2 --localPortId 2 # returns 6

While to get the MPG and the local port ID related to a certain global port ID, for example global Port 5, the following commands could be used:

getLocalPortId --globalPortId 5 # returns 1
getMPGId --globalPortId 5 # returns 2

On the other hand, to get the available MPGs, the following command could be utilized:

availableMPGs # returns "1 2"

However, fetching the ports related to a certain MPG, for example MPG 2, could be achieved using the following command:

availablePorts --mpg 2 # returns "5 6"

In such an example, both of the local ports of "MPG 1" 412, would be mapped to EPGM/Controller 410 media access control components (MAC) 1 and 2 respectively (shown by "global port 1" 420 connecting to "local port 1"

421 and "global port 2" 422 connecting to "local port 2" 423; and those of MPG 2 414 would be mapped to EPGM/Controller 410 MAC 5 and 6 (shown by "global port 5" 430 connecting to "local port 1" 431 and "global port 6" 432 connecting to "local port 2" 433). Given this configuration, starting streaming on MAC 5, for example, could be done through any of these ways:

1. start 5 --bundle . . . <other start command parameters>
2. start [getGlobalPortId --mpg 2 --localPortId 1] --bundle . . . <other start command parameters>

Also, any other port-related commands could be used in any of these two ways, giving the ability to address the port either by its design position, or MPG position.

Using this "getGlobalPortId" command and other MPG-Design addressing commands gives the ability to write and run MPG-specific testcases targeting any running MPG instances.

I. Use Model Example

By using embodiments of the disclosed technology, a design having two MPGs can be implemented in an emulation system, where the first of the MPGS can dynamically change among the following configurations:

1×100G Port—4 lanes×40b
2×40G Ports—2 lanes×40b
4×10G Ports—1 lane×20b
(2×10G Ports—1 lane×20b)+(1×50G Port—2 lanes×40b)

And the other MPG can be dynamically configured among the following configurations:

1×40G Port—4 lanes×20b
4×10G Port—1 lane×20b

Then one example compile time configuration that fits the previous configuration would be as follows:

1. Configure the first MPG with the following Compile-Time parameters:
   a. MAX_NUMBER_LANES=4
   b. MAX_LANE_WIDTH=40
   c. MAX_NUMBER_PORTS=4
   d. GLOBAL_PORT_ID_OFFSET=0
2. Configure the second MPG with the following Compile-Time parameters:
   a. MAX_NUMBER_LANES=4
   b. MAX_LANE_WIDTH=20
   c. MAX_NUMBER_PORTS=4
   d. GLOBAL_PORT_ID_OFFSET=4

Given that there are two required runtime configurations as follow:

A. Configuration 1:
a. MPG 1 running on 100G—4×40 (port 1)
b. MPG 2 running on 40G—4×20 (port 5)
B. Configuration 2:
a. MPG 1 running on 40G—2×40 (ports 1, and 2)
b. MPG 2 running on 10G—1×20 (ports 5, 6, 7, and 8)
C. Configuration 3:
a. MPG 1 running on 10G—1×20 (port 1, 2, 3, and 4)
b. MPG 2 running on 10G—1×20 (ports 5, 6, 7, and 8)
D. Configuration 4:
a. MPG 1 running on 10G and 50 G (port 1, 2, and 3)
b. MPG 2 running on 10G—1×20 (ports 5, 6, 7, and 8)

Then the subsequent code demonstrates how to perform the following steps, to use multiple configurations:

1. Configure MPGs to Configuration 1
2. Run Configuration 1 relevant testcases
3. Switch MPGs to Configuration 2
4. Run Configuration 2 relevant testcases
5. Change MPG1 to match configuration 3
6. Run Configuration 3 relevant testcases
7. Change one of the local ports configuration of MPG 2 to match Configuration 4
8. Run Configuration 4 relevant testcases

```
# Configuration1
# MPG 1
mpgLocalPort c1_m1_l1 --lanes 4 --laneSize 40
mpgConfig 1 --localPortID 1 --setPort c1_m1_l1 --startLaneIndex 1
# MPG 2
mpgLocalPort c1_m2_l1 --lanes 4 --laneSize 20
mpgConfig 2 --localPortID 1 --setPort c1_m2_l1 --startLaneIndex 1
# Apply Configuration 1 on running design
applyMpgConfig 1
applyMpgConfig 2
# Run testcases relevant to configuration 1 < . . . >
# Configuration2
# MPG 1
mpgLocalPort c2_m1_l1 --lanes 2 --laneSize 40 --speed 40
mpgLocalPort c2_m1_l2 --lanes 2 --laneSize 40 --speed 40
mpgConfig 1 --localPortID 1 --setPort c2_m1_l1 --startLaneIndex 1
mpgConfig 1 --localPortID 2 --setPort c2_m1_l2 --startLaneIndex 3
# MPG 2
mpgLocalPort c2_m2_l1 --lanes 1 --laneSize 20
mpgLocalPort c2_m2_l2 --lanes 1 --laneSize 20
mpgLocalPort c2_m2_l3 --lanes 1 --laneSize 20
mpgLocalPort c2_m2_l4 --lanes 1 --laneSize 20
mpgConfig 2 --localPortID 1 --setPort c2_m2_l1 --startLaneIndex 1
mpgConfig 2 --localPortID 2 --setPort c2_m2_l2 --startLaneIndex 2
mpgConfig 2 --localPortID 3 --setPort c2_m2_l3 --startLaneIndex 3
mpgConfig 2 --localPortID 4 --setPort c2_m2_l4 --startLaneIndex 4
# Apply Configuration 2 on running design
applyMpgConfig 1
applyMpgConfig 2
# Run testcases relevant to configuration 2
< . . . >
# Configuration3 affecting MPG 1 only
# MPG 1
mpgLocalPort c3_m1_l1 --lanes 1 --laneSize 20
mpgLocalPort c3_m1_l2 --lanes 1 --laneSize 20
mpgLocalPort c3_m1_l3 --lanes 1 --laneSize 20
mpgLocalPort c3_m1_l4 --lanes 1 --laneSize 20
mpgConfig 1 --localPortID 1 --setPort c3_m1_l1 --startLaneIndex 1
mpgConfig 1 --localPortID 2 --setPort c3_m1_l2 --startLaneIndex 2
mpgConfig 1 --localPortID 3 --setPort c3_m1_l3 --startLaneIndex 3
mpgConfig 1 --localPortID 4 --setPort c3_m1_l4 --startLaneIndex 4
# Apply configuration 3 on running design
applyMpgConfig 1 # this would only reconfigure MPG 1
without affecting MPG 2 ports
# Run testcases relevant configuration 3
< . . . >
# Configuration4 affecting local port in MPG 2 only
# MPG 1
``` mpgLocalPort c4_m1_l3 --lanes 2 --laneSize 40 --speed 50
mpgConfig 1 --localPortID 4 --removePort # Remove the extra port and free its attached MPG lane
mpgConfig 1 --localPortID 3 --setPort c4_m1_l3 --startLaneIndex 3
Apply Configuration 2 on running design
applyMpgConfig 1 --localPortID 4 # this would only reconfigure local ports 3 and 4 from MPG 1 without affecting any verification or streaming activities on other active local ports within the same MPG Upon applying Configuration1, EPGM/Controller GUI would be updated to show two ports (1 and 5); while upon applying Configuration2, the GUI would be updated to show six ports (1, 2, 5, 6, 7 and 8). After applying Configuration3, the GUI would only update ports 1 and 2 and would add ports 3 and 4 without affecting other ports (5, 6, 7 and 8); eventually it would show 8 ports (1, 2, 3, 4, 5, 6, 7 and 8). While after applying Configuration4, the GUI would remove port 4 and update port 3, showing a total of 7 ports (1, 2, 3, 5, 6, 7 and 8). Upon reconfiguring MPG1 from configuration 3 to configuration 4, if ports 1 and 2 were streaming and/or snooping on traffic before MPG1 local ports 3 and 4 are being reconfigured, they would continue to stream and/or snoop on traffic uninterrupted during and after this reconfiguration; also ports 5 through 8 in MPG2 will continue to stream and/or snoop on traffic uninterrupted during this MPG1 reconfiguration.

Figure 5:
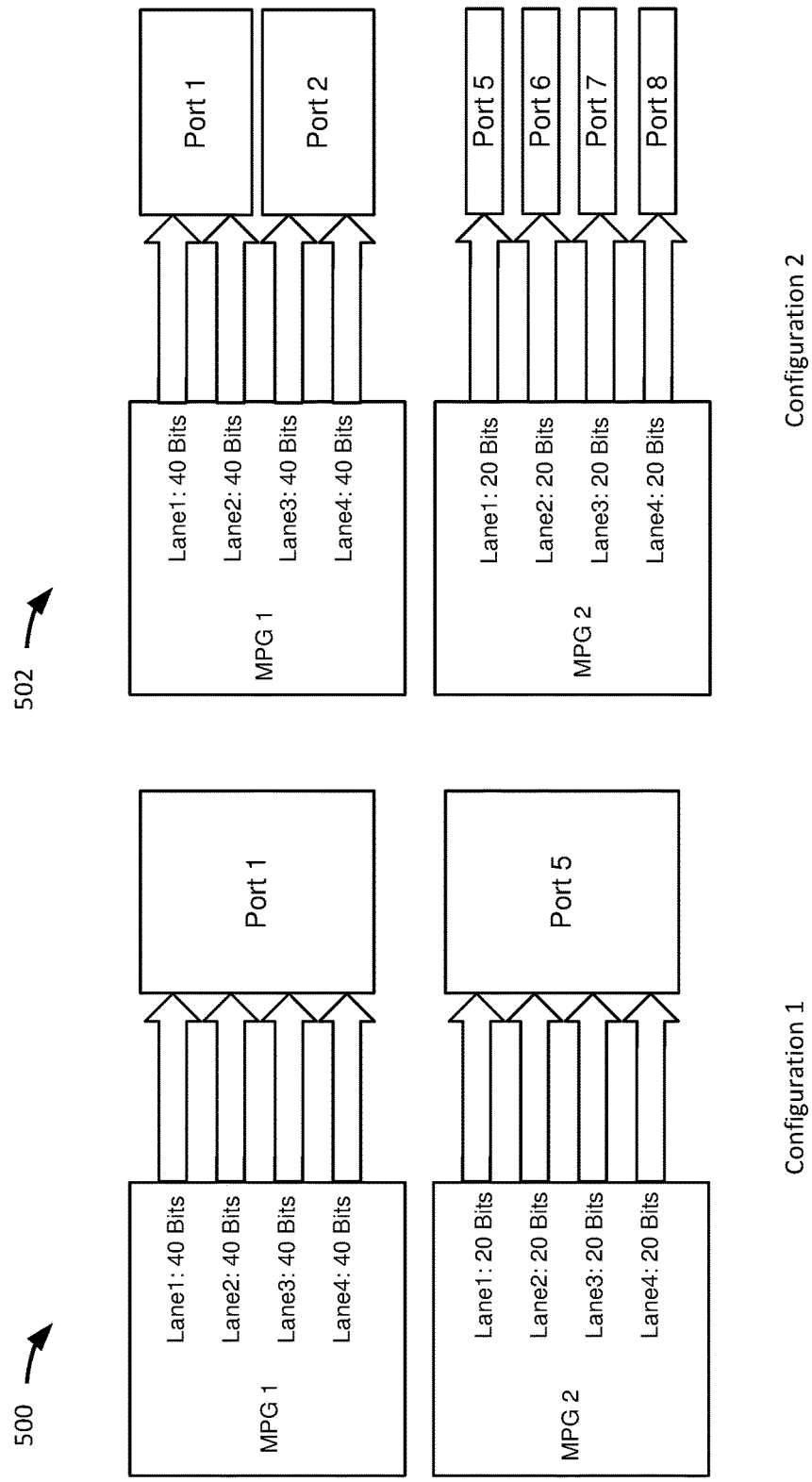
FIGS. 5 and 6 illustrate schematic block diagrams of example port configurations in accordance with embodiments of the disclosed technology.
Figure 6:
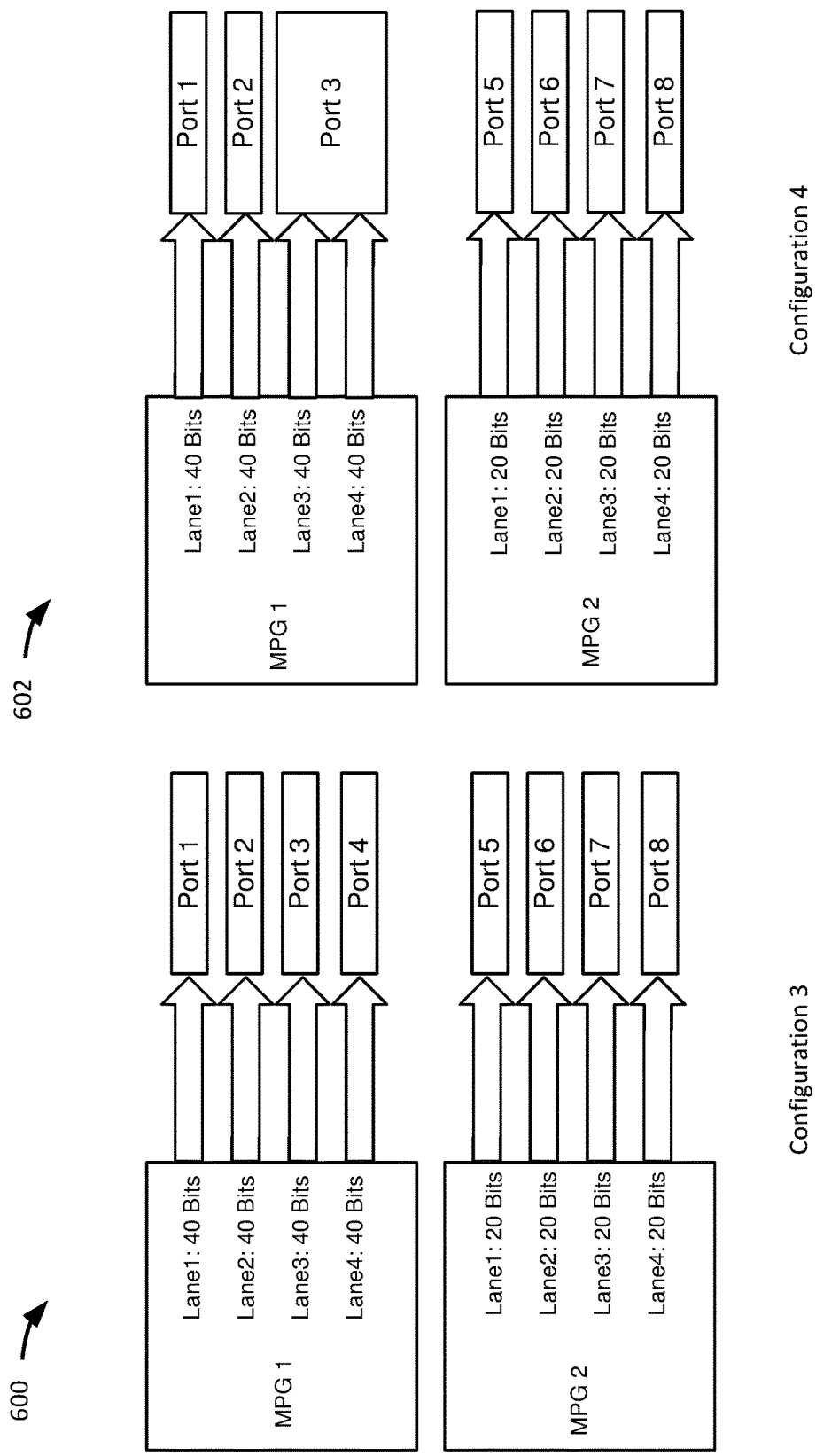

FIG. 5 is a schematic block diagram 500 illustrating Configuration 1 relative to a schematic block diagram 502 illustrating Configuration 2. Further, FIG. 6 is a schematic block diagram 600 illustrating Configuration 3 relative to a schematic block diagram 602 illustrating Configuration 4. The number of bits associated with each lane in these two figures represents the available bit width, for each of these lanes, which might be fully or partially utilized according to the specified runtime configuration.

J. Note

The previous example of the configurations of these two MPGs could be combined into only 1 MPG, based on the required usage. In such case this MPG would have compilation-time parameters of 8 for the max number of lanes, 40 for the max lane width, and at least 8 for the max number of ports. Though it is possible, but it would not be optimized in terms of area resources, as illustrated in the next Area Optimization section.

K. Area Optimization

Any of the compile-time max parameters may not be utilized to the full extent in some runtime configurations. However, if the maximum parameters configurations are not utilized to the full in any runtime configuration, the large ports groups can be split into multiple separate MPG transactors. For example if a DUT has a ports-group interface that has, for example, 8 lanes, each of them has 40b width, and the utilized in the last 4 of them are only 20b, then one can instantiate two MPGs for this group. In this example, the first would be 4 lanes×40b and the second would be 4 lanes×20b; although instantiating an MPG interface similar to this group would work but it would be less optimized in terms of area consumption. Alternatively, one may utilize an instance of MPG DPL transactor described below.

L. Example MPG Structures

Figure 7:
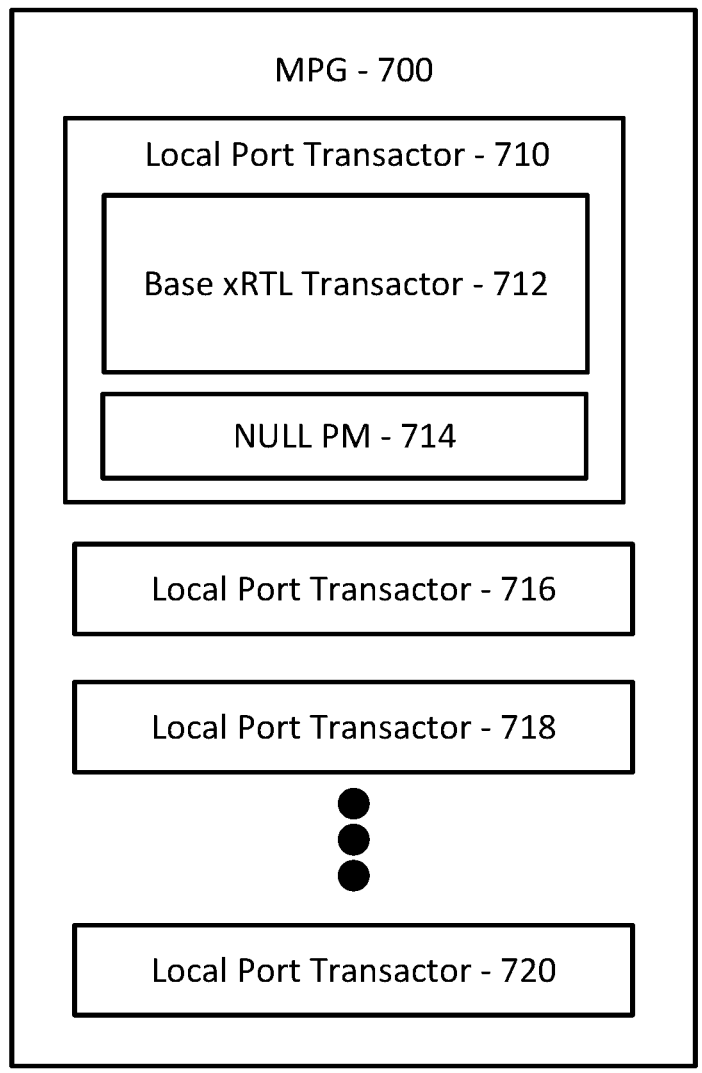
FIG. 7 is a schematic block diagram that illustrates the structure of an example mutable port group.

FIG. 7 shows the structure of an example MPG 700. The MPG 700 comprises a plurality of local port transactors 710, 716, 718, 720. Components of a representative local port transactor 710 are discussed in more detail below. As explained above, the local port transactor 710 can be configured to have a maximum number of lanes, among other configuration parameters which are defined according to the specified MPG parameters. Further, the local port transactor 710 comprises a base xRTL Transactor 712 and a NULL PM 714.

In certain example embodiments the local port transactor remains inactive until getting configured by its parent MPG transactor. In some example embodiments, the base xRTL Transactor provides an xMII Ethernet interface, which is responsible for transferring xMII data, of any of the supported Ethernet speeds, from the data generation engine to the NULL PM module to be passed to the corresponding DUT port in its ingress direction. The base xRTL Transactor can also be responsible for transferring the xMII data passed by the NULL PM module, after coming from the DUT egress direction to the monitoring engine.

Particular embodiments of the NULL PM module include Ethernet PCS and PMA modules of both the ingress and the egress directions for all supported speeds. Common and/or configurable logic modules among the supported speeds are properly shared inside this NULL PM to allow for optimized area utilization within the emulator. This NULL PM can be appropriately set up according to the speed mode in which its parent local port transactor is running.

The NULL PM 714 can further include PCS/PMA Modules and offer FEC Support (in addition to the capability of injecting different related errors).

In certain example implementations, the PCS/PMA modules include PCS/PMA-capable Ethernet interfaces compliant with IEEE Standard for Ethernet: IEEE Std 802.3-2012 clauses 36, 49, and 82. In the DUT ingress, and in certain example implementations, the PCS/PMA layer modules provide one or more of the following functionalities upon data: encoding, scrambling, lanes distribution, alignment markers insertion, bit multiplexing data to different lanes, and/or other related functionalities. While in the DUT egress direction, certain example implementations of the PCS/PMA modules provide the following functionalities upon data: decoding, descrambling, lanes aggregation, alignment markers removal, lanes de-skewing and alignment, bit de-multiplexing of data from multiple lanes and/or other related functionalities. Further, example embodiments of the FEC modules can be configured to provide Reed-Solomon or FireCode FEC. In such implementations, there can also be the capability of injecting random errors into the data stream following the FEC encoder using LFSR to generate random event that triggers error injection.

Additionally, and as more explained below, the local port transactor can provide separated transactor/transceiver clock ("STC") variations, where the STC provides different clocks for ingress and egress directions used to test ppm deviations in clock. Further, the example detailed parameters list ("DPL") transactors discussed below represent another variation of the MPG itself.

In certain implementations, upon an MPG runtime configuration change from a first configuration to a second configuration, one or more of the configured MPG local ports might need to trigger a reset on their modules or consume some clock cycles for initialization before being ready to perform any Ethernet-related verification activities. In such cases, an example of a local port transactor implementation within an MPG transactor will properly auto-reset itself upon need, keeping the reset state locked for a number of clock cycles needed for proper port initialization. This number of clock cycles could be a pre-specified one or could depend on any algorithmic logic that marks the end of initialization. One way of achieving this reset mechanism is by triggering the activation of any of the MPG local ports within its respective MPG by asserting an enable signal, which starts its respective reset loop, if needed, and triggering its deactivation by resetting this enable signal. Further, one way of triggering runtime configuration update for an already active port, of any of local ports within an MPG, can be done through an update flip signal that marks a flipping in a respective update signal for such local port. This update flip would trigger a runtime configuration update for this port upon each flip, and start its respective reset loop, if needed.

Figure 10:
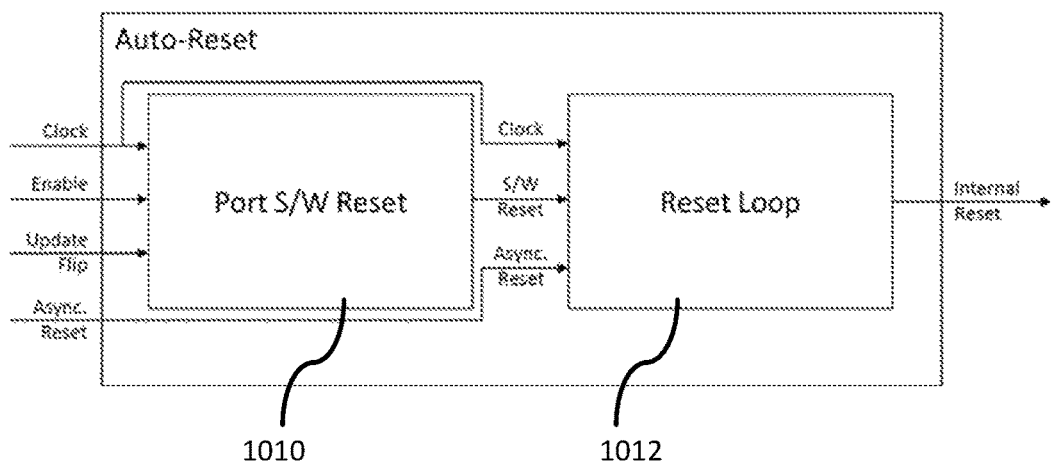
FIG. 10 is a block diagram of an example "auto-reset" module for implementing a reset function in accordance with embodiments of the disclosed technology.

FIG. 10 is a block diagram of an example "auto-reset" module 1000 for implementing a reset function in accordance with embodiments of the disclosed technology. "Port S/W Reset" block 1010 is a logic block that outputs the relevant S/W reset for a local port's relevant modules, upon need, given the previous and the current runtime states of a local port within the MPG. "Reset loop" 1012 is a logic block that keeps the local port reset locked for enough time to perform any needed port-related initialization operations.

Figure 11:
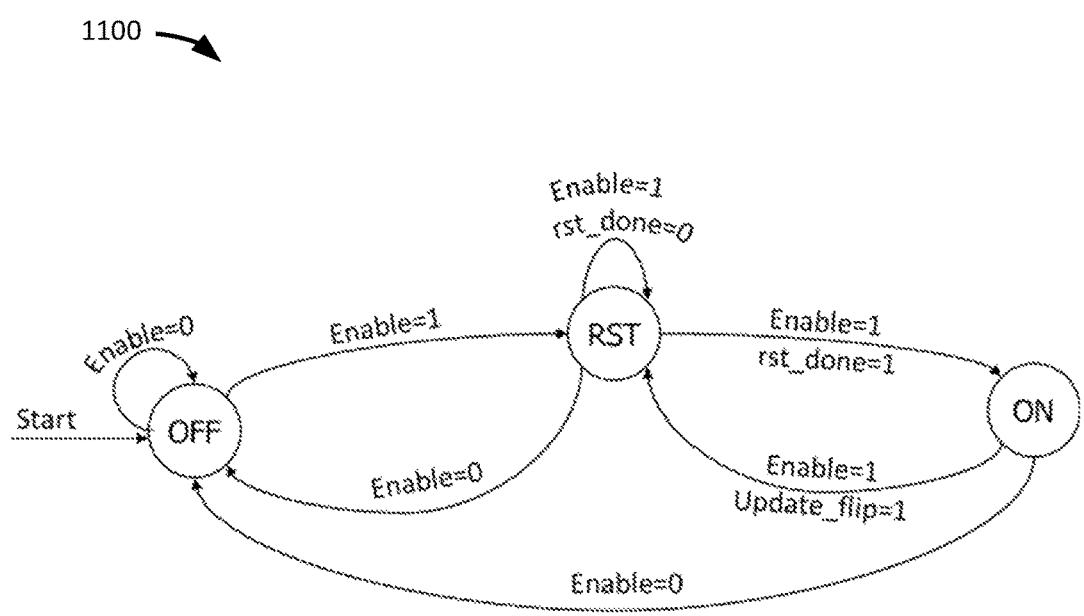
FIG. 11 is a state diagram illustrating an example set of states that can be realized by a port based on the illustrated set of signals.

FIG. 11 is a state diagram 1100 illustrating an alternative embodiment for implementing the reset function showing an example set of states that can be realized by a port (e.g., a port similar to that shown in FIG. 10 but with the set of signals illustrated in FIG. 10 and implemented by one or more modules). In the "on" state, the port is activated and ready for streaming and any other Ethernet verification activities. In the "off" state, the port is deactivated and is not available for the current runtime configuration. In the "RST" state, the port is in initialization state before being, according to an implemented initialization logic, ready for streaming and/or Ethernet verification activities after consuming the needed number of clock cycles for proper initialization. In FIG. 11, the rst_done signal would eventually drive the internal_reset signal to achieve the same effect described with respect to FIG. 10.

Figure 8:
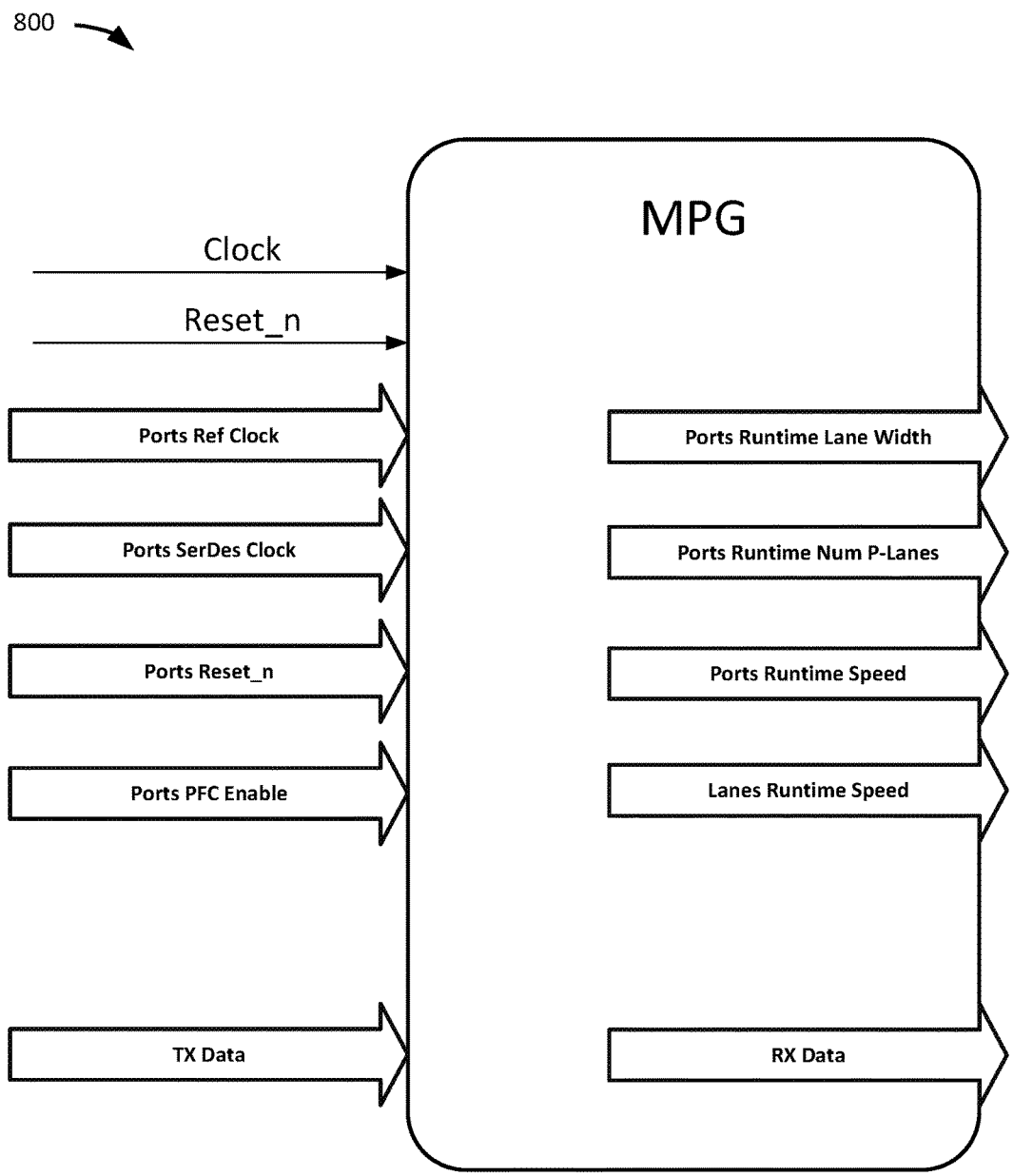
FIG. 8 is a schematic block diagram that illustrates the interfaces of an example mutable port group.

FIG. 8 shows an example set of interfaces for an MPG 800. In particular, FIG. 8 shows an example clocking scheme, which includes inputs for an MPG clock (which is typically the fastest MPG clock and is shown as "Clock"), reference clocks for each port within the MPG (shown as "ports ref clocks", and SerDes clocks for each port within the MPG that can be used to maintain a PCS SerDes to reference clock ratio (shown as "ports SerDes clocks"). The MPG 800 further includes an MPG reset (shown as "reset_n") and per-port resets for each respective port (shown as "ports reset_n"). Any one or more of these inputs can be present in embodiments of the MPG 800.

The MPG 800 further includes a number of runtime status outputs that indicate a current runtime status of the MPG 800. In the illustrated embodiment, the outputs include outputs indicating the number of runtime physical lanes for each respective port (shown as "ports runtime num P-lanes"), outputs indicating the runtime single lane width of the lanes attached to each respective port (shown as "ports runtime lane width"), outputs indicating the runtime speed for each respective port (shown as "ports runtime speed"), and outputs indicating the runtime speeds of respective ports attached to each MPG lane, specifying the per-MPG-lane port-speed (shown as "lanes runtime speed").

The example MPG 800 can use combinations of the runtime status of MPG ports and lanes outputs to properly assign different clocks to the clock inputs. Further, clock assignments can be made on per port and/or per physical lane basis. In certain embodiments, the available clocks can include an MPG ref clock, an MPG SerDes clock, and one or more design under test (DUT) clocks. As appropriate, these input clocks can be divided or otherwise modified to reach the desired clock frequency for the corresponding port.

MPG 800 also shows MPG content data transmitted to the transactor (shown as "Tx data") that is received by the MPG 800 from the output ports of the DUT and output to input ports of the DUT in accordance with the currently configured runtime ports and lanes of the MPG 800 (shown generally as "Rx data"). From the DUT's perspective, the data width of the MPG 800 can be up to the multiple of the maximum number of lanes of an MPG with the max lane width of the MPG.

M. Example MPG-DPL Transactor Summary

This subsection outlines an example MPG detailed parameters list ("DPL") transactor and provides a detailed parameters list variation of the MPG transactor. The example DPL transactor gives full control over customizing the compiled area for each individual local port inside a single MPG to fit the desired usage, yielding a more concise area. The MPG DPL transactor gives further extra flexibility on controlling different aspects of compiled internal ports, adopting different runtime configurations usage scenarios.

The MPG-DPL transactor provides per-port parameters, in addition to the original MPG global parameters. The following compile-time parameters are used to configure this MPG DPL transactor:

MPG Base Parameters:
MPG_ID—Represents the unique ID of each MPG instance that can be used to reference it.
MAX_NUM_LANES—Represents the number of SerDes lanes to be interfaced from the MPG. At runtime this number represents the maximum number of lanes that can be utilized for streaming through this MPG.
MAX_LANE_WIDTH—Represents the width of each lane that is interfaced from the MPG. At runtime this number represents the maximum lane width that can be utilized for streaming through this MPG. Example valid values are 20 bits or 40 bits.
MAX_NUMBER_PORTS—Represents the maximum number of local port interfaces inside the group that can be enabled at runtime for streaming through this group. The runtime-enabled ports are mapped inside the EPGM.
GLOBAL_PORT_ID_OFFSET—Represents an additive global port ID offset for each mutable group. This offset is used to map local port IDs to global port IDs for the whole running design. This parameter should be set so that global IDs for ports in different MPGs do not overlap with each other, as given by:

GLOBAL_ID=GLOBAL_PORT_ID_OFFSET+LOCAL_ID

For example, a port with a local ID=5 in an MPG with a global offset of 10 will have a global ID of:

GLOBAL_ID=5+10=15

A port with local ID=4 in an MPG with a global offset of 20 will have a global ID of:

GLOBAL_ID=4+20=24

MPG Per-Port Parameters:
PORTS_MAX_NUM_LANES—Array of integers where each element of the array represents the maximum number of SerDes lanes that can be used to interface with each individual port at runtime.

PORTS_MAX_LANE_WIDTH—Array of integers where each element of the array represents, for each local port within the MPG, the maximum width (number of bits) of each lane that can be used to interface with the respective individual local port within the MPG. At runtime these numbers represents the maximum lanes widths that can be utilized for streaming through each respective local port within an MPG. Example valid values are 20 bits or 40 bits.

PORTS_ONE_G_ENABLED—Array of integers where each element of the array specifies whether the Ethernet 1 Gbps speed is allowed or not for each individual local port of the MPG.

PORTS_FEC_MODE—Array of integers where each element of the array specifies the compile-time FEC mode for each individual local port of the MPG. Example Valid values are:
NO_FEC=0
FC_FEC=1
RS_FEC=2
RS_FC_FEC=3

PORTS_MAX_WIRE_DELAY—Array of integers where each element of the array represents the maximum number of clock cycles for each individual local port within the MPG. At runtime the user could specify values up to these specified maximum values for each local port within the MPG that would be utilized to emulate a wire delay between this MPG local port and its connected DUT port. If not specified, its default value is zero.

PORTS_TRANSACTOR_MODE—Array of integers where each element of the array specifies the transactor compilation mode for each of the individual local ports within the MPG. Example Valid values are: capacity_optimized and performance_optimized.

The example MPG-DPL Transactor uses the same MPG commands for runtime configuration. Supported speeds are the same as any speeds supported for an MPG example, however, the runtime local ports speeds and runtime configurations are restricted by the per-port parameters provided by MPG-DPL Transactor.

N. Use Model Example of MPG-DPL Transactor

Assume you need the following runtime configurations, for each MPG, at runtime:
CONFIG. 1. 100G—4 lanes×40 bits
CONFIG. 2. 2×50G—2 lanes×40 bits
CONFIG. 3. 2×40GR2—2 lanes×40 bits
CONFIG. 4. 40G—4 lanes×20 bits
CONFIG. 5. 4×25G—1 lane×40 bits
CONFIG. 6. 4×10G—1 lane×20 bits Given these previous configurations, one can use for an MPG DPL transactor a compile-time MAX_NUM_PORTS parameter of value 4. The following table shows the lanes usage for each of these ports, within each of these configurations.

TABLE 2

Ports Usage with Different Configurations

|  | CONFIG. 1<br>100 G | CONFIG. 2<br>2 × 50 G | CONFIG. 3<br>2 × 40 G-R2 | CONFIG. 4<br>40 G | CONFIG. 5<br>4 × 25 G | CONFIG. 6<br>4 × 10 G | MAX.<br>CONFIG. |
|---|---|---|---|---|---|---|---|
| Local Port 1 | 100 G<br>4 × 40 | 50 G<br>2 × 40 | 40G-R2<br>2 × 40 | 40 G<br>4 × 20 | 25 G<br>1 × 40 | 10 G<br>1 × 20 | 4 × 40 |
| Local Port 2 | — | 50 G<br>2 × 40 | 40G-R2<br>2 × 40 | — | 25 G<br>1 × 40 | 10 G<br>1 × 20 | 2 × 40 |
| Local Port 3 | — | — | — | — | 25 G<br>1 × 40 | 10 G<br>1 × 20 | 1 × 40 |
| Local Port 4 | — | — | — | — | 25 G<br>1 × 40 | 10 G<br>1 × 20 | 1 × 40 |
| Whole MPG | 4 × 40 | 4 × 40 | 4 × 40 | 4 × 20 | 4 × 40 | 4 × 20 | 4 × 40 |

The previous table shows that, in one example, one would desirably use for the MPG DPL a compile-time parameter MAX_NUM_LANES of value 4 and a compile-time parameter MAX_LANE_WIDTH of value 40 bits. The selection for one example per-port parameters would be as follows:

TABLE 3

Selection of Per-Port Parameters

|  | PORTS_MAX_NUM_LANES | PORTS_MAX_LANE_WIDTH | PORTS_ONE_G_ENABLED |
|---|---|---|---|
| Local Port 1 | 4 | 40 | 0 |
| Local Port 2 | 2 | 40 | 0 |
| Local Port 3 | 1 | 40 | 0 |
| Local Port 4 | 1 | 40 | 0 |

The following example virtual Ethernet Tcl commands can be used to configure each of these configurations as follows:
Define needed mpg local ports configurations
   mpgLocalPort 1p-10G --lanes 1 --laneSize 20 --speed 10
   mpgLocalPort 1p-25G --lanes 1 --laneSize 40 --speed 25
   mpgLocalPort 1p-40G --lanes 4 --laneSize 20 --speed 40
   mpgLocalPort 1p-40GR2 --lanes 2 --laneSize 40 --speed 40
   mpgLocalPort 1p-50G --lanes 2 --laneSize 40 --speed 50
   mpgLocalPort 1p-100G --lanes 4 --laneSize 40 --speed 100
Config. 1
   mpgConfig 1 --localPortID 1 --setPort lp-100G --startLaneIndex 1
   applyMPGConfig 1
Run needed tests on this config. . . .
Config. 2
   mpgConfig 1 --clear
   mpgConfig 1 --localPortID 1 --setPort lp-50G --startLaneIndex 1
   mpgConfig 1 --localPortID 2 --setPort lp-50G --startLaneIndex 3
   applyMPGConfig 1
Run needed tests on this config. . . .
Config. 3
   mpgConfig 1 --clear
   mpgConfig 1 --localPortID 1 --setPort lp-40GR2 --startLaneIndex 1
   mpgConfig 1 --localPortID 2 --setPort lp-40GR2 --startLaneIndex 3
   applyMPGConfig 1
Run needed tests on this config. . . .
Config. 4
   mpgConfig 1 --clear
   mpgConfig 1 --localPortID 1 --setPort lp-40G --startLaneIndex 1
   applyMPGConfig 1
Run needed tests on this config. . . .
Config. 5
   mpgConfig 1 --clear
   mpgConfig 1 --localPortID 1 --setPort lp-25G --startLaneIndex 1
   mpgConfig 1 --localPortID 2 --setPort lp-25G --startLaneIndex 2
   mpgConfig 1 --localPortID 3 --setPort lp-25G --startLaneIndex 3
   mpgConfig 1 --localPortID 4 --setPort lp-25G --startLaneIndex 4
   applyMPGConfig 1
Run needed tests on this config. . . .
Config. 6
   mpgConfig 1 --clear
   mpgConfig 1 --localPortID 1 --setPort lp-10G --startLaneIndex 1
   mpgConfig 1 --localPortID 2 --setPort lp-10G --startLaneIndex 2
   mpgConfig 1 --localPortID 3 --setPort lp-10G --startLaneIndex 3
   mpgConfig 1 --localPortID 4 --setPort lp-10G --startLaneIndex 4
   applyMPGConfig 1

V. Further Example Embodiments

Among the embodiments disclosed herein is an emulation system comprising one or more configurable hardware components (e.g., configurable logic blocks) configured to implement a mutable port group transactor in communication with a design under test being emulated by the emulation system. The emulation system can further comprise a host computer in communication with the emulator and configured to provide configuration commands to the emulator that alter the mutable port group transactor from a first configuration to a second configuration. In particular implementations, the mutable port group transactor is configured to emulate Ethernet ports and to communicate with the design under test at runtime adaptable communication speeds. In some examples, the mutable port group transactor is further configured to communicate with the design under test using a runtime adaptable number of lanes. In certain examples, the mutable port group transactor is further configured to communicate with the design under test via a runtime adaptable number of ports. In some examples, the mutable port group transactor is further configured to communicate with the design under test using runtime adaptable lane widths. In certain implementations, the mutable port group transactor is compiled at compile time in accordance with a number of compile-time configurations that define one or more of: a maximum number of lanes that can be streamed from the mutable port group transactor; a maximum width of each that is interfaced from the mutable port group transactor; or a maximum number of port interfaces that can be enabled during runtime through the mutable port group transactor. In particular implementations, the mutable port group transactor is compiled at compile time in accordance with a number of compile-time per-port configurations that define one or more of: a maximum number of lanes that can carry data streamed from and to a respective port; a maximum width of each lane associated with the respective port; or an indication that the respective port is allowed to stream per the specifications of a communication speed from a selected set of communication speeds. This allows, for example, different ports to have different sets of allowed speeds. As one nonlimiting example, certain values might allow a port to stream per the specification of 1G, 10G, or 25G, while other values for another port would allow the port to stream per the specifications of 10G, 25G, or 50G and so on, resulting in the allowed speeds for the first port to be {1G, 10G, 25G} and the allowed speeds for the second port being {10G, 25G, 50G}. In some implementations, the mutable port group transactor includes connections to a plurality of ports of the design under test and a subset of the connections of the mutable port group transactor can be altered without disturbing a different subset of the connections of the mutable port group transactor. In certain implementations, the mutable port group transactor is connected to the design under test via a routing matrix configured to provide a plurality of runtime adaptable connections between the mutable port group transactor and ports of the design under test. In some implementations, the mutable port group transactor is compiled at compile time in accordance with a compile-time configuration that defines a port ID offset identifying port numbers of the design under test relative to port numbers of the design under test numbers connected to another mutable port group transactor.

Figure 9:
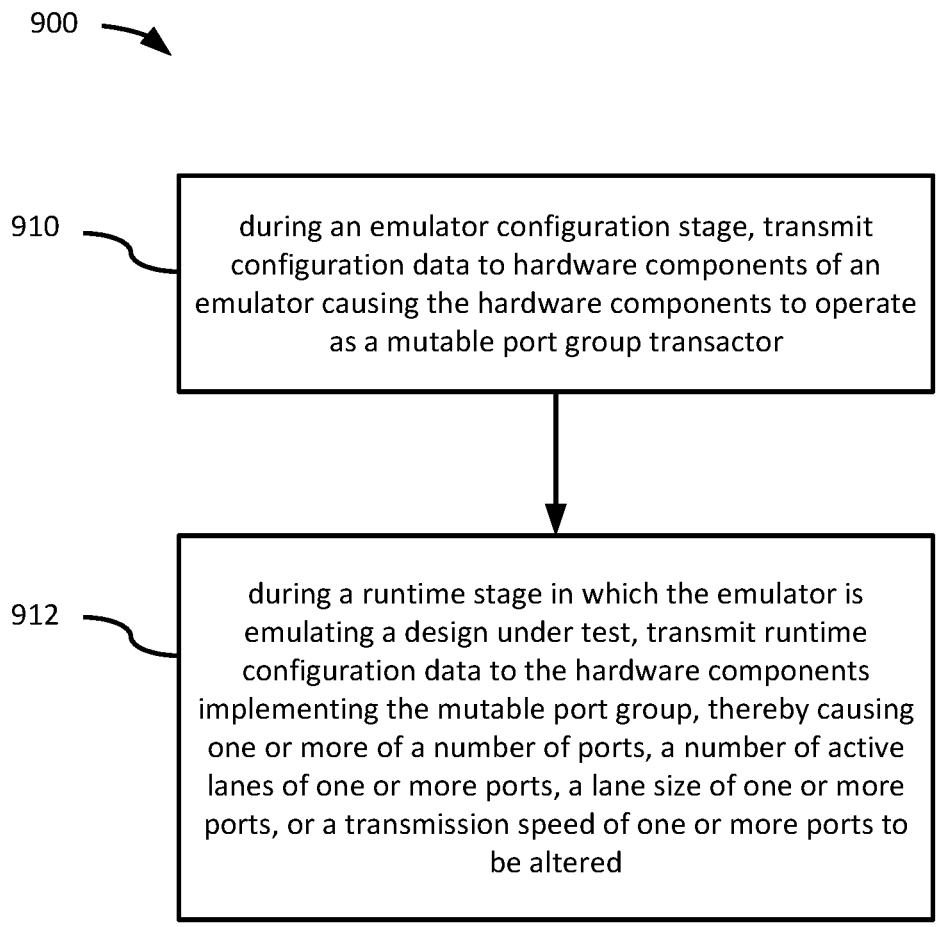
FIG. 9 is a flow chart one example technique for operating an emulator in accordance with the disclosed technology.

FIG. 9 is flowchart showing a generalized example embodiment for implementing an embodiment of the disclosed technology. The particular operations and sequence of operations should not be construed as limiting, as they can be performed alone or in any combination, subcombination, and/or sequence with one another. Additionally, the illustrated operations can be performed together with one or more other operations. Still further, the identified operations need not be performed by a single software module, but can be implemented using multiple modules or software tools, which collectively perform the illustrated method. The example embodiment of FIG. 9 can be performed, for example, by one or more specialized electronic design automation (EDA) tools that are adapted to perform the disclosed emulation compilation and runtime control techniques. The example embodiments described with respect to or related to FIG. 9 can be used to realize any one or more of the benefits disclosed herein.

At 910, during an emulator configuration stage, configuration data is transmitted to an emulator, the configuration data being adapted to configure hardware components of an emulator to operate as a mutable port group transactor.

At 912, during a runtime stage in which the emulator is emulating a design under test, runtime configuration data is transmitted to the hardware components implementing the mutable port group, thereby causing one or more of a number of ports, number of active lanes of one or more ports, a lane size of one or more ports, or a transmission speed of one or more ports to be altered.

In certain implementations, the configuration data causes the mutable port group transactor to have one or more of: a user-defined maximum number of lanes that can be streamed from the mutable port group transactor, a maximum lane width of the lanes of each port that is interfaced from the mutable port group transactor, or a maximum number of port interfaces that can be enabled during runtime through the mutable port group transactor. In particular implementations, the configuration data is per-port configuration data that causes a respective port of the mutable port group transactor to have one or more of: a maximum number of lanes that can carry data streamed from and to the respective port; a maximum width of each lane associated with the respective port; or an indication that the respective port is allowed to stream per the specifications of a communication speed from a selected set of communication speeds. In some implementations, the mutable port group transactor is configured to emulate Ethernet ports in communication with one or more ports of the design under test. In certain implementations, the mutable port group transactor is connected to the design under test via a routing matrix configured to provide a plurality of runtime adaptable connections between the mutable port group transactor and ports of the design under test. In some implementations, the configuration data defines a port ID offset identifying port numbers of the design under test relative to port numbers of the design under test connected to another mutable port group transactor.

VI, Conclusion

Having illustrated and described the principles of the disclosed technology, it will be apparent to those skilled in the art that the disclosed embodiments can be modified in arrangement and detail without departing from such principles. For example, any one or more aspects of the disclosed technology can be applied in other embodiments. In view of the many possible embodiments to which the principles of the disclosed technologies can be applied, it should be recognized that the illustrated embodiments are only preferred examples of the technologies and should not be taken as limiting the scope of the invention

What is claimed is:

1. An emulation system, comprising one or more configurable hardware components configured to implement a mutable port group transactor in communication with a design under test being emulated by the emulation system, the mutable port group transactor configured to:
   based on a configuration, update one or more Ethernet ports in communication with the design under test; and
   communicate with the design under test at a communication speed that changes during runtime while the emulation system is emulating the design under test,
   wherein the mutable port group transactor is compiled at compile time in accordance with a number of compile-time configurations that define one or more of: a maximum number of lanes that can carry data streamed from and to the mutable port group transactor; a maximum width of each lane that is interfaced with the mutable port group transactor; or a maximum number of port interfaces that can be enabled during runtime through the mutable port group transactor.

2. The emulation system of claim 1, wherein the mutable port group transactor is further configured to communicate with the design under test over lanes that change during runtime while the emulation system is emulating the design under test.

3. The emulation system of claim 1, wherein the mutable port group transactor is further configured to communicate with the design under test via ports that change during runtime while the emulation system is emulating the design under test.

4. The emulation system of claim 1, wherein the mutable port group transactor is further configured to communicate with the design under test over lanes having widths that change during runtime while the emulation system is emulating the design under test.

5. The emulation system of claim 1, wherein the mutable port group transactor is compiled at compile time in accordance with a number of compile-time per-port configurations that define one or more of: a maximum number of lanes that can carry data streamed from and to a respective port; a maximum width of each lane associated with the respective port; or an indication that the respective port is allowed to stream per the specifications of a communication speed from a selected set of communication speeds.

6. The emulation system of claim 1, wherein the mutable port group transactor includes connections to a plurality of ports of the design under test and wherein a subset of the connections of the mutable port group transactor can be altered without disturbing a different subset of the connections of the mutable port group transactor.

7. The emulation system of claim 1, wherein the mutable port group transactor is connected to the design under test via a routing matrix configured to provide a plurality of different connections during runtime while the emulation system is emulating the design under test.

8. The emulation system of claim 1, wherein the mutable port group transactor is compiled at compile time in accordance with a compile-time configurations that defines a port ID offset identifying port numbers of the design under test relative to port numbers of the design under test connected to another mutable port group transactor.

9. The emulation system of claim 1, further comprising a host computer in communication with the emulator and configured to provide configuration commands to the emulator that alter the mutable port group transactor from a first configuration to a second configuration.

10. A computer-implemented method comprising:
   during an emulator configuration stage, transmitting configuration data adapted to configure hardware components of an emulator to operate as a mutable port group transactor;

during a runtime stage in which the emulator is emulating a design under test, transmitting runtime configuration data to the hardware components implementing the mutable port group;

during the runtime stage, altering one or more of a number of ports, a number of active lanes of one or more ports, a lane size of one or more ports, or a transmission speed of one or more ports in accordance with the runtime configuration data; and based on the runtime configuration data, updating one or more Ethernet ports during the runtime stage in accordance with the runtime configuration data, wherein the configuration data causes the mutable port group transactor to have one or more of: a user-defined maximum number of lanes that can carry data streamed from and to the mutable port group transactor, a maximum width of a single lane of each port that is interfaced from the mutable port group transactor, or a maximum number of port interfaces that can be enabled during runtime through the mutable port group transactor.

11. The computer-implemented method of claim 10, wherein the configuration data is per-port configuration data that causes a respective port of the mutable port group transactor to have one or more of: a maximum number of lanes that can carry data streamed from and to the respective port; a maximum width of each lane associated with the respective port; or an indication that the respective port is allowed to stream per the specifications of a communication speed from a selected set of communication speeds.

12. The computer-implemented method of claim 10, wherein the mutable port group transactor is connected to the design under test via a routing matrix configured to provide different connections during runtime while the emulation system is emulating the design under test.

13. The computer-implemented method of claim 10, wherein the configuration data defines a port ID offset identifying port numbers of the design under test relative to port numbers of the design under test connected to another mutable port group transactor.

14. One or more non-transitory computer-readable media storing computer-executable instructions, which when executed by a computer, cause the computer to:

during an emulator configuration stage, transmit configuration data adapted to configure hardware components of an emulator to operate as a mutable port group transactor;

during a runtime stage in which the emulator is emulating a design under test, transmit runtime configuration data to the hardware components implementing the mutable port group; and based on the runtime configuration data, updating one or more Ethernet ports and communicating with the design under test at a communication speed that changes during the runtime stage while the emulator is emulating the design under test, wherein the configuration data causes the mutable port group transactor to have one or more of: a user-defined maximum number of lanes that can carry data streamed from and to the mutable port group transactor, a maximum width of each that is interfaced from the mutable port group transactor, and a maximum number of port interfaces that can be enabled during runtime through the mutable port group transactor.

15. The one or more non-transitory computer-readable media computer-implemented method of claim 14, wherein the runtime configuration data causes one or more of a number of ports of the mutable port group, a lane size of one or more ports of the mutable port group, or a transmission speed of one or more ports of the mutable port group to be altered.

16. The one or more non-transitory computer-readable media computer-implemented method of claim 14, wherein the configuration data is per-port configuration data that causes a respective port of the mutable port group transactor to have one or more of: a maximum number of lanes that can carry data streamed from and to the respective port; a maximum width of each lane associated with the respective port; or an indication that the respective port is allowed to stream per the specifications of a communication speed from a selected set of communication speeds.

17. The one or more non-transitory computer-readable media computer-implemented method of claim 14, wherein the mutable port group transactor is connected to the design under test via a routing matrix configured to provide a plurality of different connections during runtime while the emulator is emulating the design under test.

18. The one or more non-transitory computer-readable media computer-implemented method of claim 14, wherein the configuration data defines a port ID offset identifying port numbers of the design under test relative to port numbers of the design under test connected to another mutable port group transactor.

\* \* \* \* \*